United States Patent
Fifield et al.

(10) Patent No.: US 10,395,752 B2
(45) Date of Patent: Aug. 27, 2019

(54) MARGIN TEST FOR MULTIPLE-TIME PROGRAMMABLE MEMORY (MTPM) WITH SPLIT WORDLINES

(71) Applicant: GLOBALFOUNDRIES INC., Grand Cayman (KY)

(72) Inventors: John A. Fifield, Burlington, VT (US); Eric D. Hunt-Schroeder, Essex Junction, VT (US); Darren L. Anand, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/730,078

(22) Filed: Oct. 11, 2017

(65) Prior Publication Data

US 2019/0108894 A1  Apr. 11, 2019

(51) Int. Cl.
*G11C 16/04* (2006.01)
*G11C 29/50* (2006.01)
*H01L 27/11517* (2017.01)

(52) U.S. Cl.
CPC .... *G11C 29/50004* (2013.01); *G11C 16/0408* (2013.01); *H01L 27/11517* (2013.01); *G11C 2029/5004* (2013.01)

(58) Field of Classification Search
CPC .......... G11C 29/50004; G11C 16/0408; G11C 2029/5004; H01L 27/11517
See application file for complete search history.

(56) References Cited

U.S. PATENT DOCUMENTS

| | | | | |
|---|---|---|---|---|
| 5,877,972 A | * | 3/1999 | Aoki | G06F 7/5055 |
| | | | | 708/232 |
| 6,026,022 A | * | 2/2000 | Yamashita | G11C 16/10 |
| | | | | 365/185.12 |
| 6,272,054 B1 | | 8/2001 | Barth, Jr. et al. | |
| 6,704,222 B2 | | 3/2004 | Guterman et al. | |
| 6,903,961 B2 | | 6/2005 | Tsukikawa et al. | |
| 7,449,746 B2 | | 11/2008 | Guterman et al. | |
| 9,147,495 B2 | | 9/2015 | Roy et al. | |
| 9,418,740 B2 | | 8/2016 | Ogiwara et al. | |
| 9,418,745 B1 | * | 8/2016 | Chen | G11C 16/14 |
| 9,460,760 B2 | | 10/2016 | Jayaraman et al. | |
| 9,589,658 B1 | | 3/2017 | Agarwal et al. | |
| 2003/0155599 A1 | | 8/2003 | Hsu et al. | |

(Continued)

FOREIGN PATENT DOCUMENTS

TW    466489    12/2001
TW    201140588    11/2011

OTHER PUBLICATIONS

German Office Action in the related DE Application No. 10 2018 200 972.4 dated Jun. 21, 2018, 3 pages.

(Continued)

*Primary Examiner* — Mohammed A Bashar
(74) *Attorney, Agent, or Firm* — Michael Le Strange; Andrew M. Calderon; Roberts Mlotkowski Safran Cole & Calderon, P.C.

(57) ABSTRACT

The present disclosure relates to a structure which includes a twin-cell memory which includes a first device and a second device and which is configured to store data which corresponds to a threshold voltage difference between the first device controlled by a first wordline and the second device controlled by a second wordline.

20 Claims, 3 Drawing Sheets

(56) References Cited

U.S. PATENT DOCUMENTS

| | | |
|---|---|---|
| 2003/0156478 A1 | 8/2003 | Maruyama et al. |
| 2005/0157533 A1 | 7/2005 | Kaal |
| 2006/0083070 A1 | 4/2006 | Arakawa |
| 2007/0121376 A1 | 5/2007 | Toda |
| 2009/0180321 A1* | 7/2009 | Torii .................. G11C 16/0433 365/185.05 |
| 2010/0074028 A1* | 3/2010 | Hirose .................. G11C 5/145 365/185.29 |
| 2015/0138891 A1 | 5/2015 | Iyer et al. |
| 2015/0278551 A1* | 10/2015 | Iyer ........................ G06F 21/70 726/2 |
| 2018/0158532 A1* | 6/2018 | Hunt-Schroeder .... G11C 17/16 |

OTHER PUBLICATIONS

Taiwan Office Action in related TW Application No. 107101070 dated Aug. 22, 2018, 5 pages.

* cited by examiner

MARGIN TEST FOR MULTIPLE-TIME PROGRAMMABLE MEMORY (MTPM) WITH SPLIT WORDLINES

FIELD OF THE INVENTION

The present disclosure relates to a margin test, and more particularly, to a circuit and a method for margin testing for a multiple-time programmable memory (MTPM) array with split wordlines.

BACKGROUND

In high density memory systems, a typical non-volatile memory cell may include a metal-oxide semiconductor field effect transistor (MOSFET) having a parameter, e.g., a transistor device threshold voltage (Vt), that may be varied for storing desired information, e.g., by injecting charges into a floating gate or gate oxide. Accordingly, a current sunk by the memory cell in determining biasing states varies depending on the information stored therein. For example, to store information in a typical twin-transistor memory cell there is provided two different threshold voltage (Vt) values for the cell, with each different threshold voltage (Vt) value associated with a different logic or bit value.

Existing twin-cell multi-time programmable memory (MTPM) utilizes two transistors to store 1 bit of information, and uses a localized reference transistor for each cell. Use of twin-cells in MTPM open bitline architecture gives the highest density but suffers from sensing margin issues.

In a charge-trap memory, programming is achieved by altering the threshold voltage (Vt) of a field effect transistor (FET). In conventional twin-cell charge-trap memories, a pair of field effect transistors (FETs) are connected to true and complement bitlines and are controlled by a common wordline which controls the gates of the FETs. In a programming operation, programming voltages are applied to the cell and then a read verification is performed to check the adequacy of the programming. In this write-verify programming operation, a read signal margin test is performed to check a signal level to ensure the signal level is sufficient to overcome expected signal leakage and other signal detractors over the life of the memory.

In conventional charge-trap memory arrays, overcoming expected leakage and other signal detractors has been accomplished by imbalancing the sense amplifier to favor the opposite data state to make it more difficult to sense the expected data state. Further, when using the imbalanced sense amplifier approach, a current offset is applied to one side of the sense amplifier and an equivalent cell "signal" offset, or an equivalent change in a cell field effect transistor threshold voltage (FET Vt) is calculated. Further, in the conventional charge-trap memory arrays, an offset current of approximately 10 µa may be applied to one of the true or complement bitlines to correlate to an equivalent cell-programming offset of 10 mV of threshold voltage (Vt) shift. This signal margin approach is impacted by variation in cell current from process, voltage, and temperature (PVT). For example, a fast-process case will produce higher cell currents than a slow-process case and the current offset does not adjust accordingly. In fact, the current offset is fixed and may over test a slow-process chip and under test a fast-process chip. The accuracy of the signal margin approach may vary in a range from approximately 15 mV to 35 mV during a 20 mV signal margin test. This accuracy is acceptable for a one-time programmable memory (OTPM) array, but is not accurate enough to use in a multiple-time programmable memory (MTPM) array. In particular, the MTPM array may require operation with reduced signal levels.

SUMMARY

In an aspect of the disclosure, a structure includes a twin-cell memory which includes a first device and a second device and which is configured to store data which corresponds to a threshold voltage difference between the first device controlled by a first wordline and the second device controlled by a second wordline.

In another aspect of the disclosure, a structure includes a multiple time programmable memory (MTPM) array including a plurality of twin-cell storage cells arranged in a plurality of rows and columns such that each of the plurality of twin-cell storage cells include a first NFET device and a second NFET device and are configured to store data which corresponds to a threshold voltage difference between the first NFET device controlled by a first wordline and the second NFET device controlled by a second wordline.

In another aspect of the disclosure, a method includes programming a twin-cell memory with a write pulse, verifying the programmed twin-cell memory by setting a true wordline to have a higher voltage than a complement wordline, and verifying the programmed twin-cell memory by setting the true wordline to have a lower voltage than the complement wordline.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a margin test, and more particularly, to a circuit and a method for margin testing for a multiple-time programmable memory (MTPM) array with split wordlines. In more specific embodiments, the present disclosure is an improved signal margining technique which correlates more directly to the threshold voltage (Vt) programming levels of a MTPM array.

In embodiments of the present disclosure, a split wordline technique adjusts a cell field effect transistor (FET) device overdrive to correspond to a change in the threshold voltage (Vt) such that there is a 1-to-1 relationship between a differential wordline voltage and cell signal. In embodiments of the present disclosure, the margin test accuracy is limited only by the ability to generate a precision offset voltage between wordline true and wordline complement and can be held to +/−5 mV. Advantageously, the signal margining technique in the present disclosure correlates directly to the threshold voltage (Vt) programming levels of a MTPM array. Further, although the signal margining technique in the present disclosure is described for a MTPM array, embodiments are not limited to such implementation.

For example, the signal margining technique in the present disclosure can also be applicable to a one time programmable memory array (OTPM).

Figure 1:
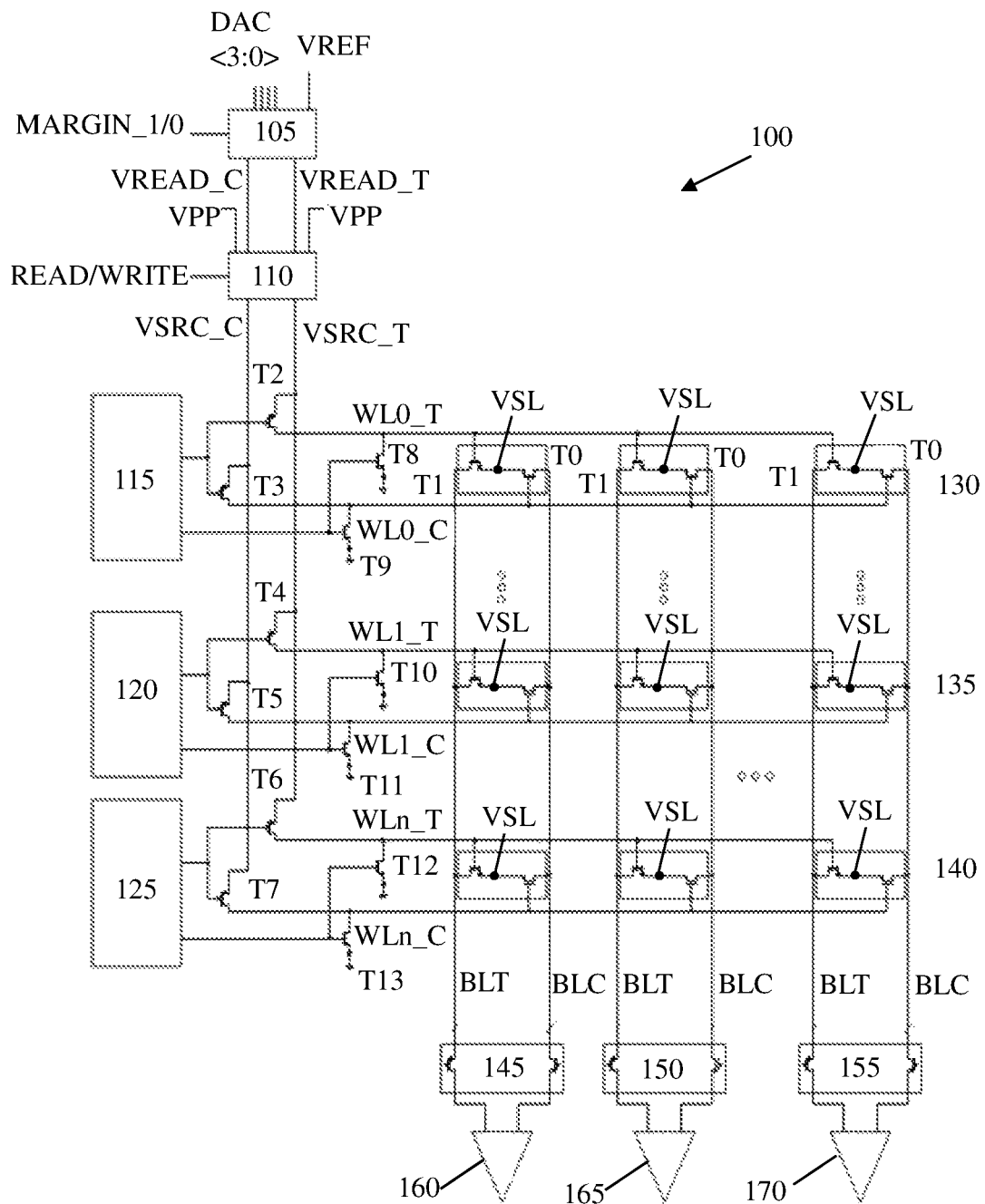
FIG. 1 shows a multiple-time programmable memory (MTPM) array with a margin adjustment in accordance with aspects of the present disclosure.

FIG. 1 shows a multiple-time programmable memory (MTPM) array with a margin adjustment in accordance with aspects of the present disclosure. In the MTPM array with the margin adjustment 100, the twin-cell memory elements (e.g., memory 130 which includes the twin-cell FET pair of T0 and T1) receive separate wordlines (e.g., true wordlines WL0_T to WLn_T and complement wordlines WL0_C to WLn_C) for the true and complement FETs (e.g., T0 and T1). Further, during a signal-margin test, a voltage offset is created between the true and complement wordlines (e.g., true wordline WL0_T and complement wordline WL0_C) which corresponds directly to a difference in an overdrive of each of the cell FETs (e.g., T0 and T1). Therefore, the voltage offset created during the signal-margin test corresponds directly with a change in FET threshold voltage (FET Vt) levels. More specifically, in FIG. 1, the MTPM array with the margin adjustment 100 includes the following components: field effect transistors (FETs) T0-T13; a reference voltage VREF; digital adjustment control (DAC) inputs <3:0>; a margin_1/0 signal; a complement voltage read signal VREAD_C; a true voltage read signal VREAD_T; a programming voltage VPP; a read/write signal READ/ WRITE; a complement source signal VSRC_C; a true source signal VSRC_T; a true bitline BLT; a complement bitline BLC; true wordlines WL0_T to WLn_T; complement wordlines WL0_C to WLn_C; a voltage read digital adjustment control circuit 105; a source decoder 110; word decoders 115, 120, and 125; memory cells 130, 135, and 140; multiplexers 145, 150, and 155; and sense amplifiers 160, 165, and 170.

Still referring to FIG. 1, FETs T0, T1, and T8-T13 are NFET devices and FETs T2-T7 are PFET devices. In particular, FET T0 has a drain connected to the complement bitline BLC, a gate connected to the complement wordline WL0_C, and a source connected to a source of FET T1 through a source line voltage (VSL) node. Further, FET T1 has a drain connected to the true bitline BLT, a gate connected to the true wordline WL0_T, and a source connected to a source of FET T0 through the source line voltage (VSL) node. FET T2 has a source connected to the true source signal VSRC_T, a gate connected to gate of FET T3, and a drain connected to the true wordline WL0_T. FET T3 has a source connected to the complement source signal VSRC_C, a gate connected to gate of FET T2, and a drain connected to the complement wordline WL0_C. FET T4 has a source connected to the true source signal VSRC_T, a gate connected to gate of FET T5, and a drain connected to the true wordline WL1_T. FET T5 has a source connected to the complement source signal VSRC_C, a gate connected to gate of FET T4, and a drain connected to complement wordline WL1_C. FET T6 has a source connected to the true source signal VSRC_T, a gate connected to gate of FET T7, and a drain connected to the true wordline WLn_T. FET T7 has a source connected to the complement source signal VSRC_C, a gate connected to gate of FET T6, and a drain connected to the complement wordline WLn_C. Although FETs T0 and T1 are discussed with reference to NFET devices, it should be understood by those of skill in the art that FETs T0 and T1 can also be representative of PFET devices.

In FIG. 1, FET T8 has a drain connected to the true wordline WL0_T, a gate connected to gate of FET T9, and a source connected to ground. FET T9 has a drain connected to the complement wordline WL0_C, a gate connected to gate of FET T8, and a source connected to ground. FET T10 has a drain connected to the true wordline WL1_T, a gate connected to FET T11, and a source connected to ground. FET T11 has a drain connected to the complement wordline WL1_C, a gate connected to gate of FET T10, and a source connected to ground. FET T12 has a drain connected to the true wordline WLn_T, a gate connected to gate of FET T13, and a source connected to ground. FET T13 has a drain connected to the complement wordline WLn_C, a gate connected to gate of FET T12, and a source connected to ground.

Still referring to FIG. 1, the voltage read digital adjustment control circuit 105 has inputs which include the reference voltage VREF, the digital adjustment control (DAC) inputs <3:0>, and the margin_1/0 signal and outputs the complement voltage read signal VREAD_C and the true voltage read signal VREAD_T. Further, the source decoder 110 has inputs which include the complement voltage read signal VREAD_C, the true voltage read signal VREAD_T, the programming voltage VPP, and the read/write signal READ/WRITE and outputs the complement source signal VSRC_C and the true source signal VSRC_T. The word decoder 115 is connected to the gate of FETs T2, T3, T8, and T9. The word decoder 120 is connected to the gate of FETs T4, T5, T10, and T11. The word decoder 125 is connected to the gate of FETs T6, T7, T12, and T13. Memory cell 130 includes the twin-cell FET pair of T0 and T1. Memory cells 135, 140 also each include a twin-cell FET pair. Further, multiplexers 145, 150, and 155 are connected between their respective sense amplifiers 160, 165, and 170 and their corresponding memory cells (e.g., memory cell 130) through the true bitline BLT and the complement bitline BLC.

In operation, un-selected wordlines are held to ground by un-selected word decoders through pull down FETs T8, T9, T10, T11, T12, and T13. Each of the FETs T8, T9, T10, T11, T12, and T13 are NFET devices which include pull down gate signals. Therefore, in FIG. 1, the NFET pull down devices T8, T9, T10, T11, T12, and T13 are activated when their corresponding PFET pull up devices (e.g., T2, T3, T4, T5, T6, T7) are unselected.

Moreover, in FIG. 1, the MTPM array with the margin adjustment 100 is provided in which each memory cell (e.g., memory cell 130) comprises a pair of FETs (e.g., FETs T0 and T1), which are connected to the true and complement bitlines (e.g., true bitline BLT and complement bitline BLC) and to current sensing sense amplifiers (e.g., sense amplifiers 160, 165, and 170). The wordlines (e.g., true wordlines WL0_T to WLn_T and complement wordlines WL0_C to WLn_C) are controlled by word decoders (e.g., word decoders 115, 120, 125). When one of the word decoders 115, 120, 125 are selected, the selected word decoder will pass a voltage level from the source signals (e.g., the complement source signal VSRC_C and the true source signal VSRC_T) to the selected wordline pair (e.g., one of the true wordlines WL0_T to WLn_T and complement wordlines WL0_C to WLn_C which correspond to the selected word decoder).

Still referring to FIG. 1, the source signals (e.g., the complement source signal VSRC_C and the true source signal VSRC_T) are driven by a selector (e.g., the source decoder 110) responsive to a read/write input (e.g., the read/write signal READ/WRITE) to choose either the programming voltage VPP or a VREAD voltage level (e.g., the complement voltage read signal VREAD_C and the true voltage read signal VREAD_T). The VREAD voltage level is provided by the voltage read digital adjustment control circuit 105 which generates the complement voltage read signal VREAD_C and the true voltage read signal VREAD_T voltage levels suitable for biasing the twin-cell FETs (e.g., FETs T0 and T1) in a region for differential current sensing by the sense amplifiers 160, 165, and 170. In embodiments, a typical VREAD voltage for the complement voltage read signal VREAD_C and the true voltage read signal VREAD_T may be equal to the threshold voltage (Vt) of a typical cell FET plus 100-200 millivolts (mV).

In embodiments of the present disclosure, the true voltage signal VREAD_T has a predetermined voltage offset from the complement VREAD_C during a read operation. The predetermined voltage offset between VREAD_T and VREAD_C is set in response to DAC inputs <3:0>. The voltage read digital adjustment control circuit 105 further includes an analog multiplexor which will pass voltage signals VREADH and VREADL on the true voltage read signal VREAD_T and the complement voltage read signal VREAD_C during the verify operations. In a programming operation of the present disclosure, a boosted level (e.g., programming voltage VPP) can be passed onto one of the true wordlines WL0_T to WLn_T and the complement wordlines WL0_C to WLn_C, or could be decoded by the polarity of the write data to only select one of the two true and complement wordlines WL0_T to WLn_T, WL0_C to WLn_C. In contrast, in a conventional read operation, the true voltage read signal VREAD_T is equal to the complement voltage read signal VREAD_C. Therefore, there is no voltage offset in the conventional read operation.

Figure 2:
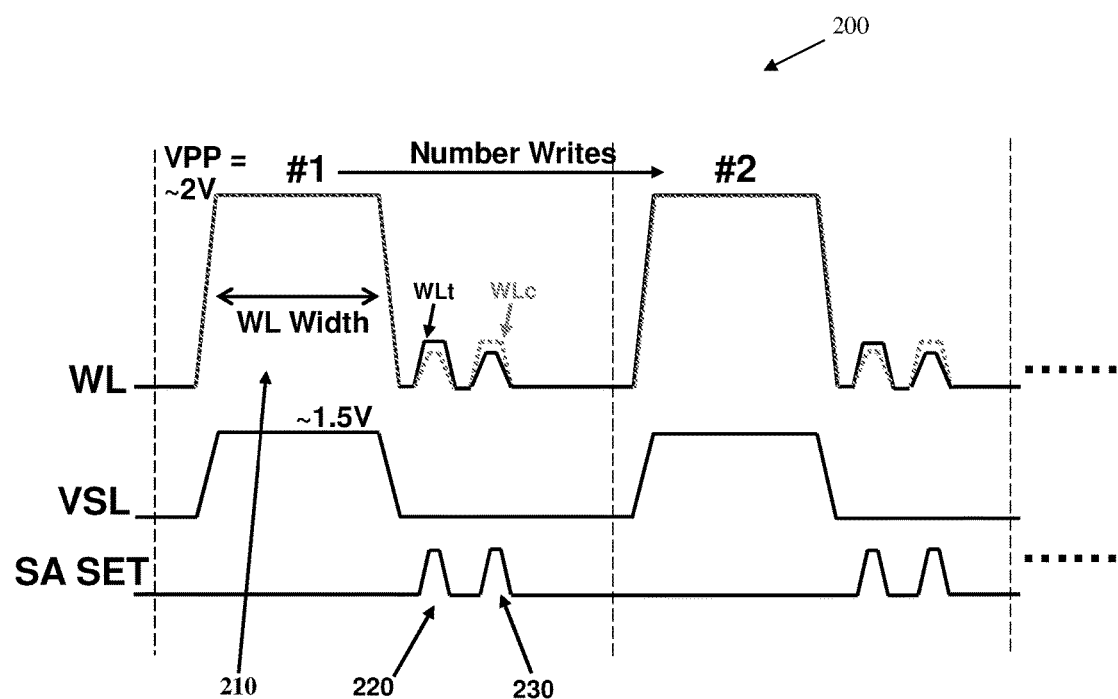
FIG. 2 shows a write operation of the MTPM array with the margin adjustment in accordance with aspects of the present disclosure

FIG. 2 shows a write operation of the MTPM array with the margin adjustment in accordance with aspects of the present disclosure. In FIG. 2, the write operation 200 includes a program operation 210 and a double verify sequence 220, 230. In FIG. 2, in the write operation 200, the x-axis is time in nanoseconds and the y-axis is voltage in Volts. Further, in FIG. 2, the number of writes in the write operation 220 are labeled as #1 (i.e., first write operation), #2 (i.e., second write operation), . . . , #N (i.e., Nth write operation).

In the program operation 210, a write pulse voltage (e.g., VPP is approximately 2 Volts) is applied to gates of the twin-cell of the MTPM array with the margin adjustment 100. Further, in the program operation 210, the bitline is grounded and the voltage of a source line VSL can be lower than the VPP voltage, e.g., 1.5 Volts. Further, as shown in FIG. 2, the wordline WL width is the duration of the VPP write pulse. The duration and voltages in FIG. 2 can be controlled with eFUSE or tester options that can be set per chip. Further, write operations are programmed to always complete within the write specification.

In FIG. 2, the double verify sequence 220, 230 includes a read (verifyA) test 220 and a read (verifyB) test 230. In the read (verifyA) test 220, a wordline true (e.g., WLt) voltage is set at a wordline complement (e.g., WLc)+margin. In a specific example, WLt=WLc+20 mV (i.e., WLt>WLc). In the read (verifyA) test 220, the cell is checked to see if the cell can pass a margined read (i.e., overwrite protection). In the read (verifyA) test 220, the bitline is sensed by a sense amplifier (160, 165 and 170 in FIG. 1) with the source line voltage (VSL) being 0 V and the wordline being approximately 500 mV. Further, in the read (verifyA) test 220, passing cells will be masked on subsequent write operations to protect them from a time dependent dielectric breakdown (TDDB) failure.

In the read (verifyB) test 230 of FIG. 2, a wordline complement (e.g., WLc) voltage is set at a wordline true (e.g., WLt)+margin. In a specific example, WLc=WLt+20 mV (i.e., WLc>WLt). In the read (verifyB) test 230, the cell is checked to see if the cell can pass a margined read (i.e., overwrite protection). In the read (verifyB) test 230, the bitline is sensed by a sense amplifier floated with the source line voltage (VSL) being 0 V and the wordline being approximately 500 mV. Further, in the read (verifyB) test 230, passing cells will be masked on subsequent write operations to protect them from the TDDB failure.

In FIG. 2, after the first write operation (i.e., labeled as #1) of the write operation 200, subsequent program operations will mask bits that pass the previous reads (e.g., read (verifyA) test 220 and read (verifyB) test 230). In the read (verifyA) test 220, WLt>WLc. In the read (verifyB) test 230, WLc>WLt.

In a functional (e.g., customer) read operation of the present disclosure, a split wordline array has the true and complement wordlines at different potentials during a programming read-margin test (e.g., WL_T≠WL_C) and at equal potentials for a normal read operation after programming (e.g., WL_T=WL_C). During a programming operation, both the true wordline and complement wordline are at the same elevated potential. Further, in embodiments of the present disclosure, the MTPM split wordline array may have an array threshold voltage (VT) of 300 mV and use read-margin wordline voltages of 400 mV for one wordline (e.g., WL_T) and 420 mV for the other wordline (e.g., WL_C) in a 20 mV margin test. During a normal read operation after an address has been programmed will have both wordlines (e.g., WL_T and WL_C) shorted together at the same potential.

Figure 3:
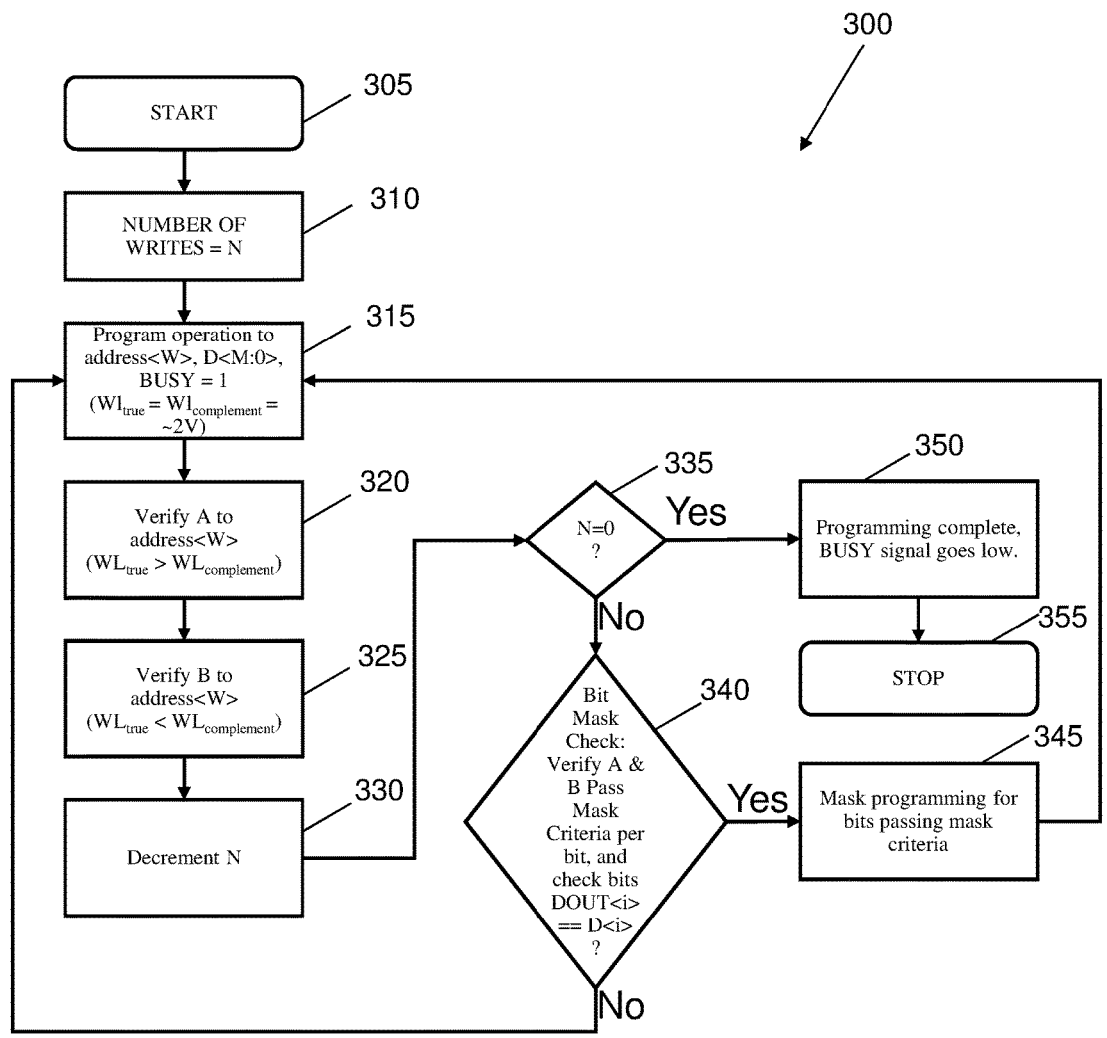
FIG. 3 shows a flowchart of the MTPM array with the margin adjustment in accordance with aspects of the present disclosure.

FIG. 3 shows a flowchart of the MTPM array with the margin adjustment in accordance with aspects of the present disclosure. In FIG. 3, the flowchart 300 shows a method of programming in accordance with embodiments of the present disclosure. In FIG. 3, the method starts at step 305. At step 310, a number of writes is set to "N". At step 315, a program operation is performed to address <W> for data D <M:0> with a BUSY signal set to 1. Further, at step 315, the program operation will set the true wordline WLtrue (e.g., WLt)=the complement wordline WLcomplement (e.g., WLc)=approximately 2 V. At step 320, a verify A operation is performed for address <W> to verify the program operation in step 315. Further, at step 320, the verify A operation will set the WLtrue (e.g., WLt)>WLcomplement (e.g., WLc).

At step 325, the verify B operation is performed for address <W> to further verify the program operation in step 315. Further, at step 325, the verify B operation will set the WLtrue (e.g., WLt)<WLcomplement (e.g., WLc). At step 330, "N" is decremented. At step 335, it is determined if there are still write operations to be performed (i.e., if "N"=0). If "N"=0 (i.e., step 335 is YES), then at step 350, programming is complete and the BUSY signal goes low (i.e., BUSY signal set to 0). At step 355, the process ends.

Still referring to FIG. 3, if "N"≠0 (i.e., step 335 is NO), then at step 340, a bit mask check is performed. At step 340, both verify A and verify B operations are performed with a pass mask criteria per bit. Further, at step 340, data output bits DOUT <i> are checked with data input bits D <i> to see if DOUT <i>==D <i>. If the bit mask check is not successful (i.e., DOUT <i>≠D <i> and therefore step 340 is NO), then the process returns to step 315 to perform another program operation. If the bit mask check is successful (i.e., DOUT <i>=D <i> and therefore step 340 is YES), then the process goes to step 345. At step 345, mask programming is performed for bits which pass the mask criteria. Then, the process returns to step 315 to perform another programming operation.

The circuit and method for margin testing for a multiple-time programmable memory (MTPM) array with split wordlines of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and method for margin testing for a multiple-time programmable memory (MTPM) array with split wordlines of the present disclosure has been adopted from integrated circuit (IC) technology. For example, the structures are built on wafers and are realized in films of material patterned by photolithographic processes on the top of a wafer. In particular, the fabrication of the circuit and method for margin testing for a multiple-time programmable memory (MTPM) array with split wordlines uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a twin-cell memory which includes a first device and a second device and which is configured to store data which corresponds to a threshold voltage difference between the first device controlled by a first wordline and the second device controlled by a second wordline; and
a voltage read digital adjustment circuit which is configured to drive a differential voltage between a voltage level of the first wordline and a voltage level of the second wordline to a threshold offset of the twin-cell memory during a signal margin test operation,
wherein the first wordline is connected to a gate of the first device, the second wordline is connected to a gate of the second device, and the first wordline is a different wordline than the second wordline.

2. The structure of claim 1, wherein the first device and the second device are field effect transistors (FETs) of the twin-cell memory, the structure is a multiple time programmable memory (MTPM) array, and the voltage read digital adjustment circuit receives a reference voltage, a plurality of digital adjustment control (DAC) inputs, and a margin signal.

3. The structure of claim 2, wherein the first device and the second device are NFETs, the first device has a drain connected to a complement bitline, the gate connected to a complement wordline, and a source connected to a source line voltage node, and the second device has a drain connected to a true bitline, the gate connected to a true wordline, and a source connected to the source line voltage node.

4. The structure of claim 2, wherein the first device and the second device are PFETs.

5. The structure of claim 1, wherein the first wordline has a higher voltage potential than the second wordline during a true data type test of the signal margin test operation in which a cell is checked to determine if the cell passes a margined read test and masking a passing cell during subsequent write operations.

6. The structure of claim 1, wherein the first wordline has a lower voltage potential than the second wordline during a complement data type test of the signal margin test operation in which a cell is checked to determine if the cell passes a margined read test and masking a passing cell during subsequent write operations.

7. The structure of claim 1, wherein the first wordline is enabled with a same voltage potential as the second wordline during a non-signal margin test read operation by shorting the first wordline and the second wordline together.

8. The structure of claim 7, wherein the same voltage potential is a threshold voltage of the twin-cell memory plus about 50-200 mV during the non-signal margin test read operation.

9. A structure comprising a multiple time programmable memory (MTPM) array which includes a plurality of twin-cell storage cells arranged in a plurality of rows and columns such that each of the plurality of twin-cell storage cells include a first NFET device and a second NFET device and are configured to store data which corresponds to a threshold voltage difference between the first device controlled by a first wordline and a second device controlled by a second wordline, and a voltage read digital adjustment circuit which is configured to drive a differential voltage between a voltage level of the first wordline and a voltage level of the second wordline to a threshold offset of the twin-cell storage cells during a signal margin test operation,
wherein the first wordline is connected to a gate of the first device, the second wordline is connected to a gate of the second device, and the first wordline is a different wordline than the second wordline.

10. The structure of claim 9, wherein the first wordline has a higher voltage potential than the second wordline during a true data type test of the signal margin test operation in which a cell is checked to determine if the cell passes a margined read test and masking a passing cell during subsequent write operations.

11. The structure of claim 9, wherein the first wordline has a lower voltage potential than the second wordline during a complement data type test of the signal margin test operation in which a cell is checked to determine if the cell passes a margined read test and masking a passing cell during subsequent write operations.

12. The structure of claim 9, wherein the first wordline is enabled with a same voltage potential as the second wordline during a non-signal margin test read operation by shorting the first wordline and the second wordline together.

13. The structure of claim 12, wherein the same voltage potential is a threshold voltage of the twin-cell memory plus about 50-200 mV during the non-signal margin test read operation.

14. A method, comprising:
programming a twin-cell memory with a write pulse;
driving a differential voltage between a voltage level of a true wordline and a voltage level of a complement wordline to a threshold offset of the twin-cell memory during a signal margin test operation;
verifying the programmed twin-cell memory by setting the true wordline to have a higher voltage than the complement wordline; and
verifying the programmed twin-cell memory by setting the true wordline to have a lower voltage than the complement wordline,
wherein the twin-cell memory comprises a first device and a second device, one of the true wordline and the complement wordline is connected to a gate of the first device, a remaining one of the true wordline and the complement wordline is connected to a gate of the second device, and the true wordline is a different wordline than the complement wordline.

15. The method of claim 14, further comprising masking cells of the twin-cell memory which have passed verification on subsequent programming operations to protect them from a time dependent dielectric breakdown (TDDB) failure.

16. The method of claim 14, wherein the first device comprises a first NFET device, the second device comprises a second NFET device, the first NFET device is controlled by the true wordline, the second NFET device is controlled by the complement wordline, the first device has a drain connected to a complement bitline, the gate connected to the complement wordline, and a source connected to a source line voltage node, and the second device has a drain connected to a true bitline, the gate connected to the true wordline, and a source connected to the source line voltage node.

17. The method of claim 14, wherein a first data type is programmed by changing a threshold voltage of the first device of the twin-cell memory in response to the true wordline having the higher voltage than the complement wordline, and a second data type is programmed by changing a threshold voltage of the second device of the twin-cell memory in response to the true wordline having the lower voltage than the complement wordline.

18. The method of claim 14, wherein the twin-cell memory comprises a first PFET device and a second PFET device.

19. The structure of claim 1, wherein the twin-cell memory is programmed by applying programming voltages using an eFUSE.

20. The structure of claim 19, wherein the applying the programming voltages using the eFUSE further comprises applying a write pulse voltage to gates of the twin-cell memory, grounding a bitline, and setting a voltage of a source line to be lower than the write pulse voltage.

* * * * *